US010185376B2

United States Patent
Jun et al.

(10) Patent No.: US 10,185,376 B2
(45) Date of Patent: Jan. 22, 2019

(54) HEAT SINK HAVING PROTECTION FOR ELECTRIC SHOCK AND ELECTRONIC DEVICE INCLUDING THE SAME

(71) Applicant: Samsung Electronics Co., Ltd., Gyeonggi-do (KR)

(72) Inventors: Jung Hwan Jun, Gyeonggi-do (KR); Jong Min Choi, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 24 days.

(21) Appl. No.: 15/175,268

(22) Filed: Jun. 7, 2016

(65) Prior Publication Data
US 2017/0003723 A1   Jan. 5, 2017

(30) Foreign Application Priority Data
Jul. 1, 2015   (KR) .................. 10-2015-0094363

(51) Int. Cl.
*G06F 1/20* (2006.01)
*G06F 1/16* (2006.01)
*H05K 7/20* (2006.01)
*H04M 1/02* (2006.01)

(52) U.S. Cl.
CPC ............ *G06F 1/203* (2013.01); *G06F 1/1656* (2013.01); *H04M 1/0266* (2013.01); *H05K 7/20445* (2013.01); *H05K 7/20509* (2013.01)

(58) Field of Classification Search
CPC .............. H05K 7/20954–7/20963; H05K 7/20472–7/20481; G06F 1/20; G06F 1/203

USPC ........... 361/679.54, 713; 174/548; 165/80.2; 362/373, 218
See application file for complete search history.

(56) References Cited

U.S. PATENT DOCUMENTS

| | | | | |
|---|---|---|---|---|
| 5,982,617 A | * | 11/1999 | Haley | G06F 1/20 361/679.26 |
| 7,660,105 B2 | * | 2/2010 | Hwang | H05K 5/0247 248/309.1 |
| 7,705,536 B2 | * | 4/2010 | Yanagawa | H05K 7/20963 313/582 |
| 8,807,820 B2 | * | 8/2014 | Noh | G02F 1/133308 362/294 |
| 9,244,504 B2 | * | 1/2016 | Hsieh | G06F 1/20 |
| 9,244,505 B2 | * | 1/2016 | Yu | G06F 1/203 |
| 9,247,034 B2 | * | 1/2016 | Hsieh | G06F 1/20 |
| 9,411,385 B2 | * | 8/2016 | Pierce | G06F 1/1658 |
| 9,417,494 B2 | * | 8/2016 | Kim | G02F 1/13452 |
| 9,680,206 B2 | * | 6/2017 | Youn | H04M 1/0249 |

(Continued)

FOREIGN PATENT DOCUMENTS

KR   20-0398620 Y1   10/2005

*Primary Examiner* — Dion R Ferguson
*Assistant Examiner* — Amir Jalali
(74) *Attorney, Agent, or Firm* — Cha & Reiter LLC.

(57) ABSTRACT

An electronic device includes a display module that outputs a screen by using supplied power, and a heat sink with an electric shock prevention function prevents an electric shock accident by using a stable insulation structure. An inner housing is disposed under the display module, and the heat sink is disposed between the display module and the inner housing. A surface of the heat sink faces the inner housing is insulated, and an outer housing is disposed under the inner housing.

16 Claims, 7 Drawing Sheets

(56) References Cited

U.S. PATENT DOCUMENTS 9,720,462 B2 * 8/2017 Merz .................... G06F 1/20
2016/0044826 A1 * 2/2016 Hartl .................... F27D 21/00
361/709

* cited by examiner

HEAT SINK HAVING PROTECTION FOR ELECTRIC SHOCK AND ELECTRONIC DEVICE INCLUDING THE SAME

CLAIM OF PRIORITY

This application claims the benefit of priority under 35 U.S.C. § 119(a) from a Korean patent application filed on Jul. 1, 2015 in the Korean Intellectual Property Office and assigned Serial number 10-2015-0094363, the entire disclosure of which is hereby incorporated by reference.

BACKGROUND

Field of the Disclosure

The present disclosure relates to an electric shock protection structure of an electronic device.

Description of the Related Art

An electronic device supports various user functions. To this end, various pieces of hardware are embedded within the electronic device. A conventional electronic device is manufactured to be slim (e.g., a fixed thickness or less), to permits ease of handling and facilitate transportability. Accordingly, the conventional electronic device uses a metallic case to maintain a certain degree of strength, because the portability of the electronic device, which is often handheld, also increases the likelihood that the device could be damaged from being dropped, etc.

In an electronic device that utilizes a metallic case, in the event that the electric shock (or an electrification) generated when using electric power needed to operate the electronic device, a function may be generated. Accordingly, an electric shock accident may frequently occur during use of the conventional electronic device.

SUMMARY

Aspects of the present disclosure address at least some of the above-mentioned problems and/or disadvantages and provide at least at the advantages described herein below. Accordingly, an aspect of the present disclosure provides a heat sink with an electric shock prevention function that prevents an electric shock accident by providing a stable insulation structure, and an electronic device including the same.

Another aspect of the present disclosure provides a heat sink is provided with an electric shock prevention function includes a stable insulation structure and yet maintains a slim shape without an increase in a thickness, despite the stable insulating structure. and an electronic device including the same.

In accordance with an aspect of the present disclosure, an electronic device is provided which includes a display module that outputs a screen by using supplied power. An inner housing is disposed under the display module, a heat sink is disposed between the display module and the inner housing, wherein a surface of the heat sink faces the inner housing is insulated, and an outer housing is disposed under the inner housing.

The heat sink according to various embodiments may include, for example, a board part that performs (or acts as) a function of dissipating heat generated by the display module, a bonding layer disposed on the board part, and an insulating layer disposed under the board part.

Other aspects, advantages, and salient features of the disclosure will become better appreciated to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be better-understood by a person of ordinary skill in the art from the following description taken in conjunction with the accompanying drawings, in which.

Throughout the drawings, it should be noted that like reference numbers are used to depict the same or similar elements, features, and structures.

DETAILED DESCRIPTION

Figure 1:
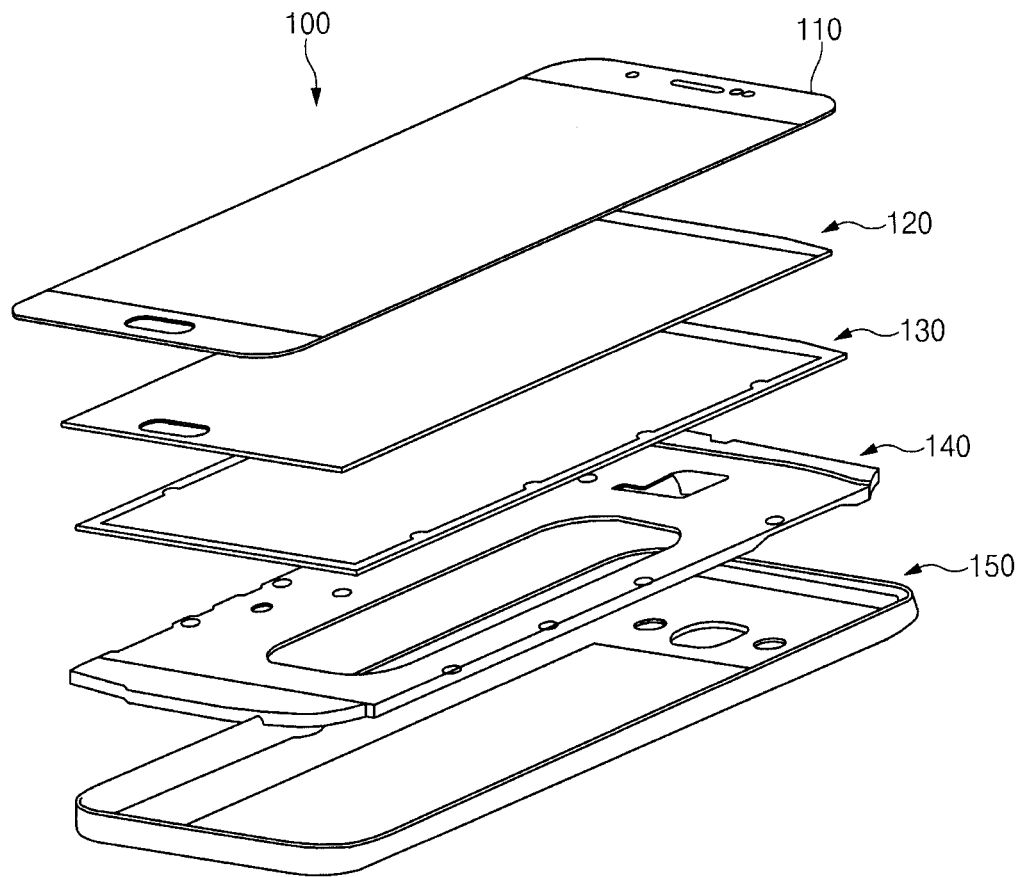
FIG. 1 is an exploded perspective view of an electronic device according to an embodiment of the disclosure.

Various embodiments of the present disclosure are disclosed with reference to accompanying drawings. Accordingly, those of ordinary skill in the art will recognize that modifications, equivalents, and/or alternatives of the various embodiments described herein may be made without departing from the scope and spirit of the present disclosure. With regard to description of drawings, similar components may be marked by similar reference numerals.

In the disclosure disclosed herein, the expressions "have", "may have", "include" and "comprise", or "may include" and "may comprise" used herein indicate existence of corresponding features (e.g., elements such as numeric values, functions, operations, or components) but do not exclude presence of additional features.

In the disclosure disclosed herein, the expressions "A or B", "at least one of A or/and B", or "one or more of A or/and B", and the like used herein may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used herein may refer to various elements of various embodiments of the present disclosure, but do not limit the elements. For example, "a first user device" and "a second user device" indicate different user devices regardless of the order or priority. For example, without departing the scope of the present disclosure, a first element may be referred to as a second element, and similarly, a second element may be referred to as a first element.

It will be understood that when an element (e.g., a first element) is referred to as being "(operatively or communicatively) coupled with/to" or "connected to" another element (e.g., a second element), it can be directly coupled with/to or connected to the other element or an intervening element (e.g., a third element) may be present. In contrast, when an element (e.g., a first element) is referred to as being "directly coupled with/to" or "directly connected to" another element (e.g., a second element), it should be understood that there are no intervening element (e.g., a third element).

According to the situation, the expression "configured to" used herein may be used as, for example, the expression "suitable for", "designed to", "adapted to", "made to", or "capable of". The term "configured to" does not only mean "specifically designed to" in hardware. Instead, the expression "a device configured to" may mean that the device is configured to operate together with another device or other components. CPU, for example, a "processor configured to perform A, B, and C" may mean a dedicated processor (e.g., an embedded processor) for performing a corresponding operation or a generic-purpose processor (e.g., a central processing unit (CPU) or an application processor) which may perform corresponding operations by executing one or more software programs which are stored in a non-transitory memory device.

Terms used in this specification are used to illustrate certain embodiments of the present disclosure and do not limit the scope of the appended claims to only those embodiments illustrated herein. The terms of a singular form may include plural forms unless otherwise specified to the contrary. Unless otherwise defined herein, all the terms used herein, which include technical or scientific terms, may have the same meaning that is generally understood by a person skilled in the art. It will be further understood that terms that are defined in a dictionary and commonly used should also be interpreted as a person of ordinary skill would interpret them according to the custom in the relevant related art and not in an idealized or overly formal detect unless expressly so defined herein in various embodiments of the present disclosure. In some cases, even if terms are terms which are defined in the specification, such terms may not be interpreted to exclude embodiments of the present disclosure.

An electronic device according to various embodiments of the present disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices. According to various embodiments, the wearable device may include at least one of an accessory type (e.g., watches, rings, bracelets, anklets, necklaces, glasses, contact lens, or head-mounted-devices (HMDs), a fabric or garment-integrated type (e.g., an electronic apparel), a body-attached type (e.g., a skin pad or tattoos), or an implantable type (e.g., an implantable circuit).

According to an embodiment of the disclosure, the electronic device may be a home appliance. The home appliances may include at least one of, for example, televisions (TVs), digital versatile disc (DVD) players, audios, refrigerators, air conditioners, cleaners, ovens, microwave ovens, washing machines, air cleaners, set-top boxes, TV boxes (e.g., Samsung HomeSync™, Apple TV™, or Google TV™), game consoles (e.g., Xbox™ and PlayStation™), electronic dictionaries, electronic keys, camcorders, electronic picture frames, and the like.

According to various embodiments of the disclosure, the electronic devices may include at least one of medical devices (e.g., various portable medical measurement devices (e.g., a blood glucose monitoring device, a heartbeat measuring device, a blood pressure measuring device, a body temperature measuring device, and the like)), a magnetic resonance angiography (MRA), a magnetic resonance imaging (MRI), a computed tomography (CT), scanners, and ultrasonic devices), navigation devices, global positioning system (GPS) receivers, event data recorders (EDRs), flight data recorders (FDRs), vehicle infotainment devices, electronic equipment for vessels (e.g., navigation systems and gyrocompasses), avionics, security devices, head units for vehicles, industrial or home robots, automatic teller's machines (ATMs), points of sales (POSs), or interne of things (e.g., light bulbs, various sensors, electric or gas meters, sprinkler devices, fire alarms, thermostats, street lamps, toasters, exercise equipment, hot water tanks, heaters, boilers, and the like).

According to various embodiments of the disclosure, the electronic devices may include at least one of parts of furniture or buildings/structures, electronic boards, electronic signature receiving devices, projectors, or various measuring instruments (e.g., water meters, electricity meters, gas meters, or wave meters, and the like). According to various embodiments of the disclosure, the electronic device may be one of the above-described devices or a combination thereof An electronic device according to an embodiment may be a flexible electronic device. Furthermore, an electronic device according to an embodiment may not be limited to the above-described electronic devices and may include other electronic devices and new electronic devices according to the development of technologies.

Hereinafter, electronic devices according to an embodiment of the present disclosure will be described with reference to the accompanying drawings. The term "user" used herein may refer to a person who uses an electronic device or may refer to a device (e.g., an artificial electronic device) that uses an electronic device.

FIG. 1 is an exploded perspective view of an electronic device according to an embodiment of the disclosure.

Referring now to FIG. 1, the electronic device 100 may include an outer cover 110, a display module 120, a heat sink 130, an inner housing 140, and an outer housing 150. In the electronic device 100, the display module 120 may be disposed under the outer cover 110 (e.g., glass or transparent plastic). The heat sink 130 may be disposed under the display module 120. The inner housing 140, in which various pieces of control hardware for an operation of the display module 120 are disposed, may be disposed under the heat sink 130. The outer housing 150 may be disposed under the inner housing 140. The outer housing 150 may receive the inner housing 140, the heat sink 130, and the display module 120 and may be disposed to surround side surfaces of the display module 120, the heat sink 130, and the inner housing 140. The outer cover 110 may be connected with the outer housing 150 while being disposed on the display module 120. According to an embodiment, the electronic device 100 may have an insulating layer which is disposed under the heat sink 130. The heat sink 130 is electrically insulated from the inner housing 140. Accordingly, at least part of the inner housing 140 and at least part of the outer housing 150 that are formed of a metallic material that may be electrically isolated (or insulated) from the display module 120.

The outer cover 110 may have, for example, a transparent area corresponding to a display area of the display module and an opaque area corresponding to a non-display area. The display module 120 may be disposed under the transparent area of the outer cover 110 corresponding to the display area. For example, the opaque area may include a home button hole from which a home button extends there-through. According to various embodiments of the disclosure, a back key area, a menu key area, and the like may be disposed in the opaque area. Furthermore, a front camera hole, a proximity sensor hole, a speaker hole, and the like may be disposed at one side (e.g., an upper side) of the opaque area. The outer cover 110 may be formed from glass or a plastic, or an acrylic material that is at least partially transparent.

The display module 120 may include, for example, a display panel that outputs a screen and a panel driving unit (or panel driver, panel driving processor) driving the display panel. The display module 120 may have, for example, the display area and the non-display area in which the panel driving unit is disposed. The panel driving unit may be disposed at one side (e.g., an upper side) of the display panel. A ground of the display panel and a ground of the panel driving unit may be disposed on a rear surface or a side surface of the display module 120. Accordingly, the display module 120 may be physically or electrically connected with the heat sink 130 that is disposed under the display module 120. For example, at least one line of the display module 120 may be grounded to the heat sink 130. According to an embodiment, the display module 120 may have a rectangular shape in which one side thereof is larger than another side thereof. According to various embodiments of the disclosure, the size of the display module 120 may vary according to a design scheme. The display module 120 may include, for example, a flat panel display module such as a liquid crystal display (LCD) module, an organic light emitting diode (OLED) module, or the like. Furthermore, the display module 120 may be configured such that at least a portion thereof corresponds to a flat area and the other portions correspond to a curved area.

As shown in FIG. 1, the heat sink 130 may be disposed under the display module 120. The heat sink 130 may include a board part that is disposed to face toward the display module 120 and dissipates heat generated by the display module 120. Furthermore, the heat sink 130 may include an insulating layer that is disposed between the board part and the inner housing 140 to electrically insulate the heat sink 130. The board part may be formed of a metallic material having a specific thickness that performs (or plays a role, or acts as) a heat dissipating function. For example, the board part may be formed of a material (e.g., copper, aluminum, silver, or the like) having a thermal conductivity of a specific value or more. The heat sink 130 may include at least one wrinkle in the light of heat dissipation efficiency. The area of the heat sink 130 may be similar to that of the display module 120, for example. According to various embodiments of the disclosure, the heat sink 130 may be formed to have a surface that is similar to the surface of the inner housing 140. According to various embodiments, an additional insulating layer may be disposed at a periphery (or an edge area) of the heat sink 130 to prevent an electrical contact between the inner housing 140 and the display module 120, thus reducing the risk of damage or electrical shock.

The inner housing 140 may include, for example, a bracket that supports the heat sink 130. Alternatively, the inner housing 140 may include a rear board of the electronic device 100. At least a portion of the inner housing 140 may be formed of a metallic material. The inner housing 140 may be disposed under the heat sink 130. The inner housing 140 may include, for example, a battery seating area in which a battery or the like is disposed. At least one boss (e.g., a hole for skew-coupling and a peripheral area defining the hole) may be disposed at a periphery (or an edge area) of the inner housing 140. According to an embodiment of the disclosure, the inner housing 140 may be provided to have a rectangular shape similar to that of the display module 120 and may include a plurality of bosses disposed on four peripheries thereof. A camera area in which a camera module is disposed, a home button area in which a home button is disposed, and the like may be disposed on one side of the inner housing 140. An area in which a touch pad associated with a back key, a menu key, or the like is disposed may be disposed on one side of the inner housing 140. According to various embodiments of the disclosure, a printed circuit board may be disposed under the inner housing 140. Various pieces of hardware of the electronic device 100, for example, an integrated circuit, such as at least one processor (e.g., an application processor, a communication processor, or the like), at least one antenna, a communication chip, a connector, and the like may be mounted on the printed circuit board. In this case, the printed circuit board may be disposed under the inner housing 140 to face the outer housing 150.

At least a portion of the inner housing 140 may be formed of a metallic material. According to an embodiment of the disclosure, the whole inner housing 140 may be formed of a metallic material. Alternatively, most areas of the inner housing 140 including the bosses may be formed of a metallic material. Some areas of the inner housing 140, for example, one side of a corner of the inner housing 140 may be formed of a material such as plastics or reinforced plastics. The inner housing 140 may be coupled to the outer housing 150 by a connection member inserted into a boss, for example, by a screw. Accordingly, the connection member is coupled between the inner housing and the outer housing An entirety or at least a portion of the outer housing 150 may be formed of a metallic material. The outer housing 150 may be provided such that the inner housing 140, the heat sink 130, and the display module 120 are fixedly seated therein. For example, the outer housing 150 may have a bottom facing the inner housing 140 and four sidewalls extending from a periphery of the bottom at a specific angle (e.g., an angle of about 90 degrees, substantially perpendicular) by a specific height. Corners of the four sidewalls may be interconnected to form a band shape. Heights of the four sidewalls may be similar to a sum of thicknesses of the inner housing 140, the heat sink 130, the display module 120, and the outer cover 110. Screw connection parts may be disposed at areas of the outer housing 150 corresponding to the plurality of bosses disposed in the inner housing 140. At least one or more screws may be connected with the screw connection parts formed inside the outer housing 150 through-holes that are formed in the bosses. According to various embodiments, the outer housing 150 may have a camera exposure area through which a camera is exposed to the outside, a hole area through which a lamp or the like is exposed, and the like. Furthermore, a battery may be seated in and fixed to one side of the outer housing 150. The outer housing 150 may include, for example, an integral rear board, a cover board, or the like.

Figure 2:
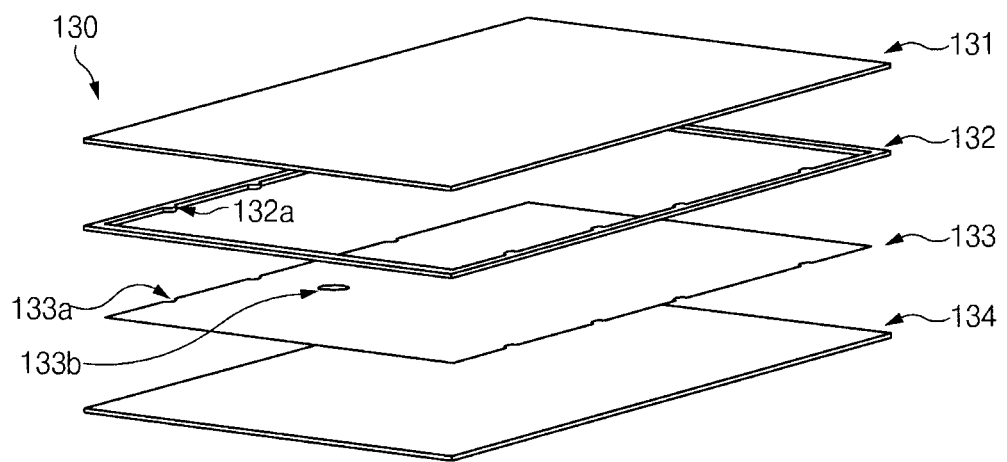
FIG. 2 is a view illustrating an example of a heat sink according to an embodiment of the disclosure.

FIG. 2 is a view illustrating an example of the heat sink according to an embodiment of the disclosure.

Referring now to FIG. 2, the heat sink 130 may include a bonding layer 131, an insulating bonding layer 132, a board part 133, and an insulating layer 134.

The bonding layer 131 may have, for example, an area corresponding to an area of the board part 133. At least one of surface (e.g., a front surface and a rear surface) of the bonding layer 131 may have a bonding characteristic(s). Accordingly, one side surface of the bonding layer 131 may be bonded to the display module 120, and the opposite side surface thereof may be bonded to the board part 133. According to an embodiment of the disclosure, the bonding layer 131 may include a double-sided tape. A thickness of the bonding layer 131 may be a specific value or less to transfer heat generated by the display module 120 to the board part 133. The bonding layer 131 may be provided in the form of a film and may be disposed on the board part 133. Alternatively, the bonding layer 131 may be formed by applying an adhesive material on the board part 133.

The insulating bonding layer 132 may have a "band" shape, and the insulating bonding layer 132 may be provided to surround an edge of the bonding layer 131. The insulating bonding layer 132 may have a shape corresponding to the edge of the bonding layer 133. For example, the insulating bonding layer 132 may have the form of a quadrangular band and may have at least one protrusion 132a extending from the inside of the band towards the board part 133. The protrusion 132a may have a shape corresponding to a recess formed at the board part 133. The insulating bonding layer 132 may be bonded to the insulating layer 134 and may be bonded to the upper display module 120. A thickness of the insulating bonding layer 132 may correspond to a thickness of the board part 133. The insulating bonding layer 132 may be disposed to have a thickness corresponding to a sum of thicknesses of the board part 133 and the bonding layer 131.

With continued reference to FIG. 1 and the heat sink 130 shown in FIG. 2, the board part 133 may perform (or act as) a function of dissipating heat generated by the display module 120. In this connection, the board part 133 may be formed of a material having a thermal conductivity of a specific value or more, and may be disposed under the display module 120. Furthermore, the board part 133 may act as a ground of the display module 120. During an operation of the display module 120, current may flow through the board part 133. The board part 133 may be bonded and fixed to a rear surface of the display module 120 by using the bonding layer 131 disposed on a front surface thereof. The insulating layer 134 may be disposed on a rear surface of the board part 133. The board part 133 may include at least one recess 133a and a through-hole 133b. For example, the board part 133 may include recesses 133a corresponding to at least one boss or boss areas provided at a periphery of the inner housing 140. Each of the recesses 133a may include an area that is recessed from the periphery of the board part 133 to the inside thereof The through-hole 133b may be disposed at a specific area of the inside of the board part 133. The through-hole 133b may also be disposed at a location corresponding to a boss area provided inside the inner housing 140. Even though the insulating layer 134 or the bonding layer 131 may be damaged due to stabbing or the like, the recesses 133a and the through-hole 133b may prevent the display module 120 and the inner housing 140 from making electrical contact with each other. According to an embodiment of the disclosure, the recesses 133a and the through-hole 133b may prevent a screw, which connects the inner housing 140 and the outer housing 150, from making electrical contact with the display module 120. Improved reliability and safety can result from this structure. According to various embodiments, in the electronic device 100, the inner housing 140, the printed circuit board, and the outer housing 150 may be fixedly screw-coupled to each other.

Since the inner and outer housings 140 and 150 of a metallic material are electrically connected with the printed circuit board, the recesses 133a and the through-hole 133b may be provided in areas where screws are disposed. The insulating bonding layer 132 may be disposed on the recesses 133a. A portion of the insulating layer 134 may be disposed under the through-hole 133b, and a portion of the bonding layer 131 may be disposed on the through hole-133b.

The insulating layer 134 may be disposed under the board part 133 and under the insulating bonding layer 132. The insulating layer 134 may electrically isolate the board part 133 by using a material of a specific hardness or more, for example, a film of a specific thickness and a hardened property. The insulating layer 134 may be fixedly bonded to the board part 133 and the insulating bonding layer 132. A lower surface of the insulating layer 134 may face the inner housing 140. The insulating layer 134 may be formed of, for example, a plastic material, a polymer material, or a rubber material that has an electrically insulating property.

Figure 3:
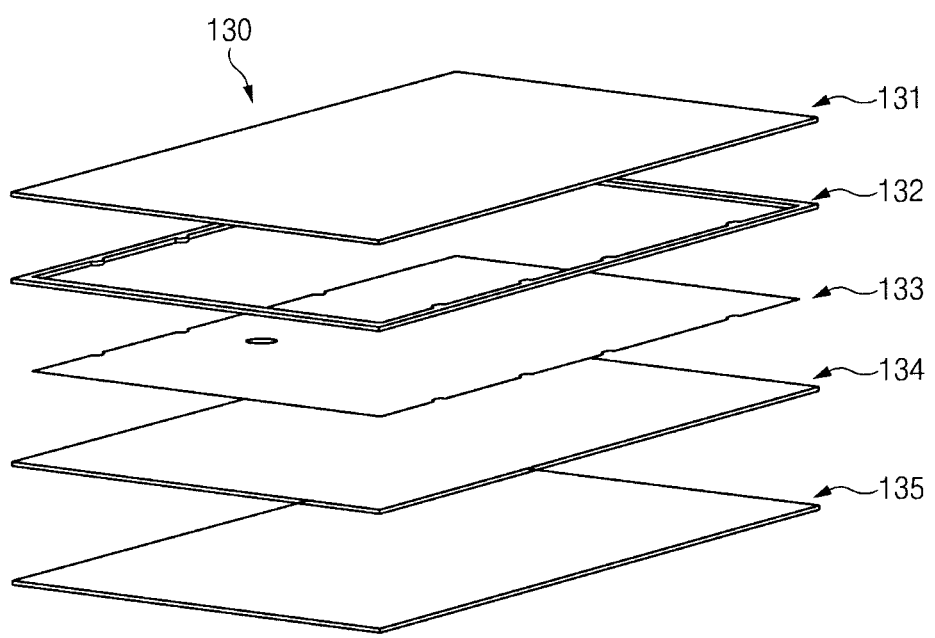
FIG. 3 is a view illustrating another example of a heat sink according to an embodiment of the disclosure.

FIG. 3 is a view illustrating another example of the heat sink according to an embodiment.

Referring now to FIG. 3, the heat sink 130 may include a first bonding layer 131, the insulating bonding layer 132, the board part 133, the insulating layer 134, and a second bonding layer 135. The elements 131 to 134 of the heat sink 130 may be the same as or similar to those of FIG. 2 except for the second bonding layer 135. For example, the bonding layer 131 described with reference to FIG. 2 may correspond to the first bonding layer 131. The insulating bonding layer 132 may include a double-sided tape. The insulating bonding layer 132 may be the same as or similar to the insulating bonding layer 132 described with reference to FIG. 2.

The second bonding layer 135 may be disposed under the insulating bonding layer 134. The second bonding layer 135 may include, for example, a material that is the same as that of the first bonding layer 131. The second bonding layer 135 may fix the heat sink 130 to the inner housing 140. According to various embodiments, the second bonding layer 135 may not be disposed in the heat sink 130 but may be disposed on one side (e.g., a surface facing the heat sink 130) of the inner housing 140.

Figure 4A:
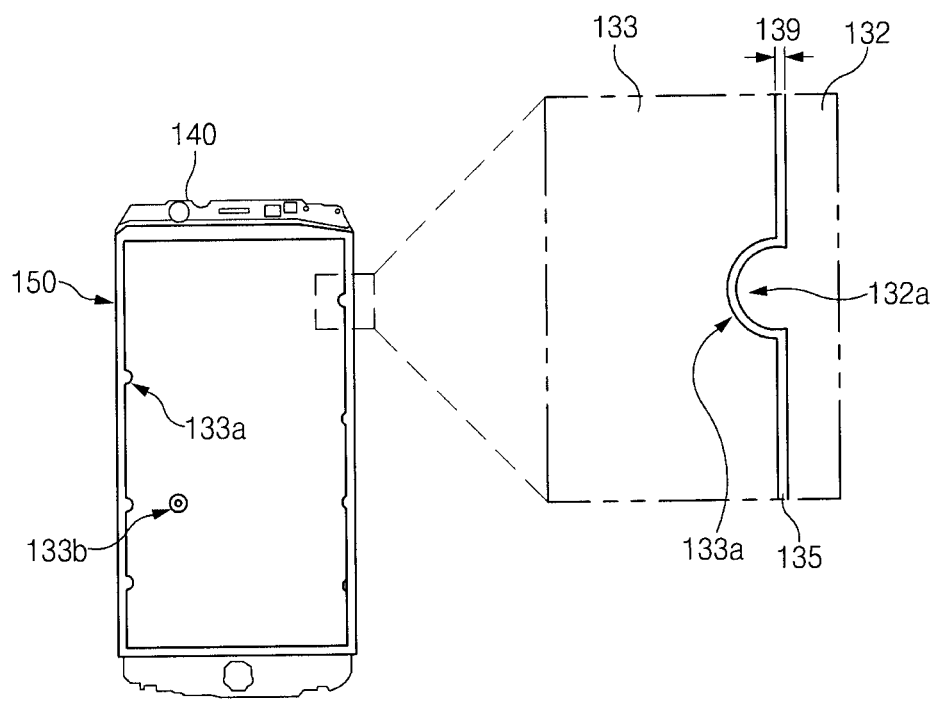
FIG. 4A is a view illustrating another example of a configuration of the electronic device according to an embodiment of the disclosure.
Figure 4B:
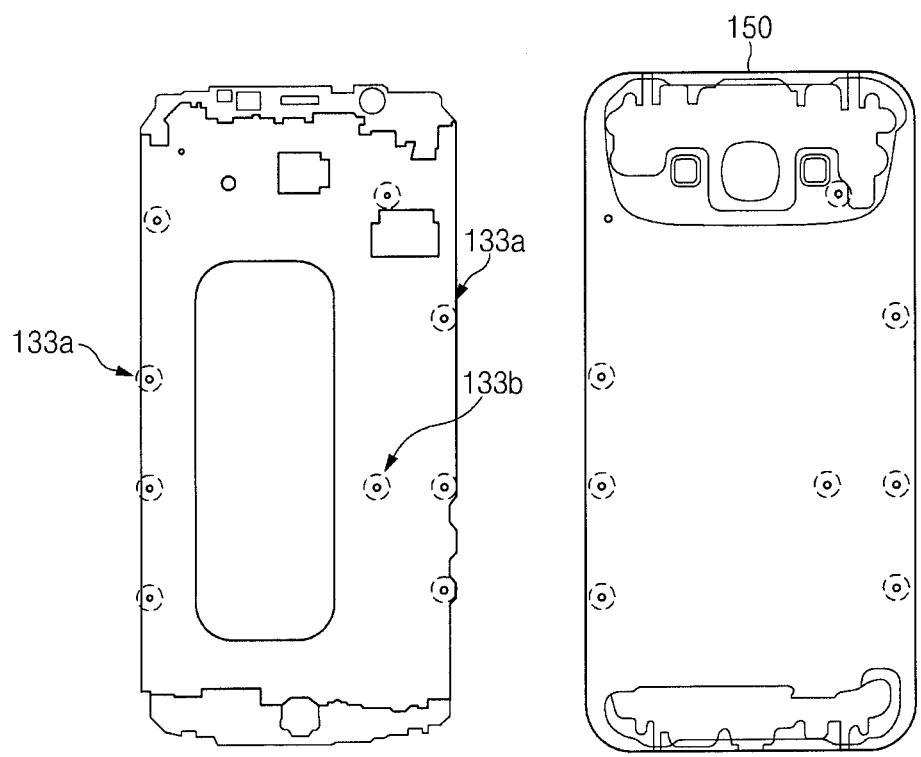
FIG. 4B is a view illustrating examples of the inner housing and the outer housing according to an embodiment of the disclosure.

FIG. 4A is a view illustrating another example of a configuration of the electronic device according to an embodiment of the present disclosure, and FIG. 4B is a view illustrating examples of the inner housing and the inner housing according to an embodiment of the present disclosure.

Referring now to FIGS. 4A and 4B, a configuration of the electronic device 100 according to an embodiment may include the inner housing 140, the outer housing 150, and the heat sink 130. In the heat sink 130, the insulating bonding layer 132 and the board part 133 may be disposed on the insulating layer 135 to be spaced apart from each other. For example, the board part 133 may be disposed at a center portion of the insulating layer 135. The insulating bonding layer 132 may be situated on the insulating layer 135 to be located at a periphery of the board part 133 and may be disposed to be spaced apart from the board part 133 by a specific distance. With this structure, a gap 139 may exist between the insulating bonding layer 132 and the board part 133. The gap 139 may have, for example, a width of 0.01 to 1 mm. Alternatively, the gap 139 may have a width of 0.1 to 0.5 mm. The gap 139 may have an interval for preventing the insulating bonding layer 132 from overlapping the board part 133 while the insulating bonding layer 132 is disposed on the insulating layer 134. In the case where the board part 133 and the insulating bonding layer 132 overlap each other, a corresponding portion (e.g., an overlapping portion) may be formed to be thicker than the other portion thereof. In this case, an external pressure may be concentrated on an overlapping area between the board part 133 and the insulating bonding layer 132. Accordingly, in the case where an impact due to the external pressure or stabbing is generated, a periphery of the overlapping area may be damaged or stabbed. The gap 139 may be also formed between the recesses 133a of the board part 133 and the protrusions 132a of the insulating bonding layer 132. In this connection, the protrusion 132a may be formed to have a shape similar to a shape of the recess 133a.

The inner housing 140 may include bosses 143a that are disposed in areas corresponding to the recesses 133a. The outer housing 150 may include a screw connection part 153a that is disposed at an area corresponding to the boss 143a. A screw may be coupled through the boss 143a and the screw connection part 153a. According to various embodiments, a screw may be coupled with the screw connection part 153a through the printed circuit board, which is disposed under the inner housing 140, and the boss 143a, thus securely connecting the inner housing 140 and the printed circuit board to the outer housing 150.

Figure 5:
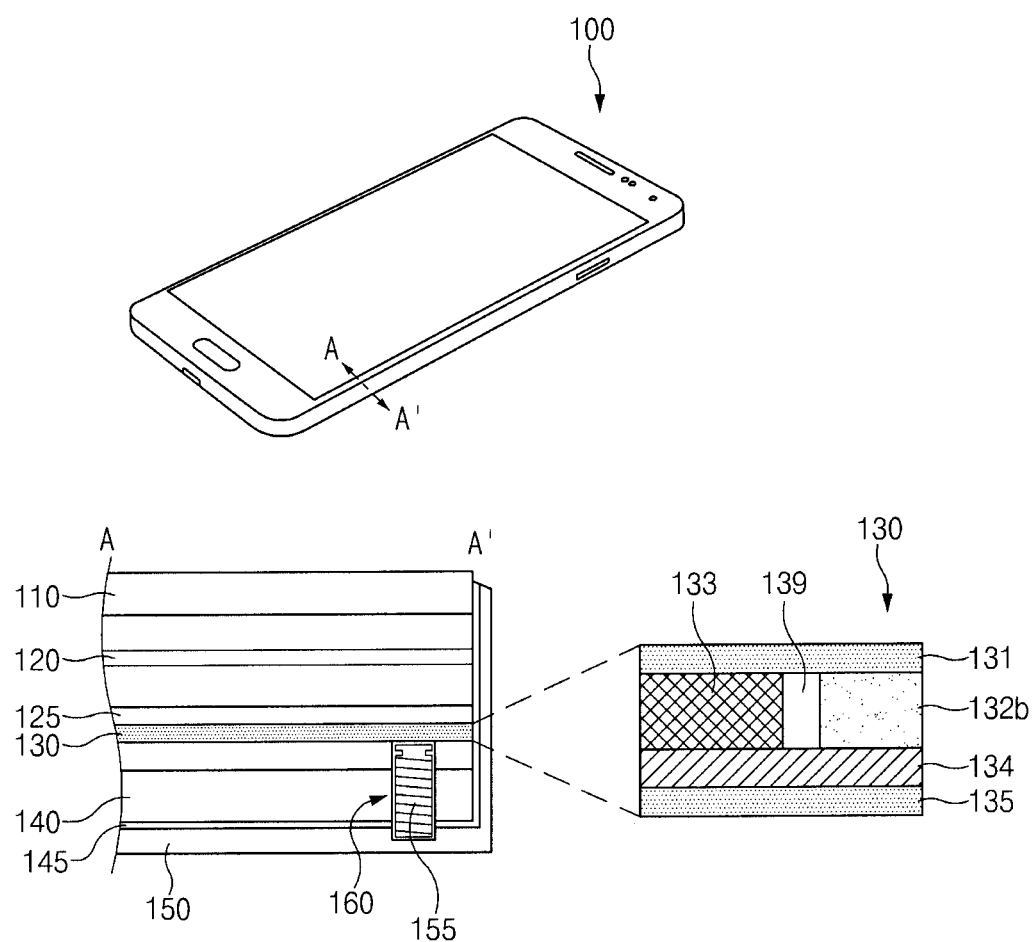
FIG. 5 is a view illustrating an example of a portion of a section of the electronic device according to an embodiment of the disclosure.

FIG. 5 is a view illustrating an example of a portion of a section of the electronic device according to an embodiment.

Referring now to FIG. 5, the electronic device 100 shown may include the outer cover 110, the display module 120, the heat sink 130, the inner housing 140, and the outer housing 150. According to various embodiments, the electronic device 100 may further include a module sub-member 125 that is disposed between the display module 120 and the heat sink 130. A flexible bonding layer may be formed on an upper surface of the heat sink 130 to make close contact with the display module 120. A hard insulating layer of a specific thickness may be formed on a lower surface of the heat sink 130, thus insulating an electrical connection between the display module 120 and the lower structure (e.g., the inner housing 140 and the outer housing 150). This structure results in the electronic device 100 preventing an electric shock due to electric power introduced through the outer housing 150.

The outer cover 110 may be formed of, for example, glass or a transparent material of a specific hardness and may be provided to cover a part or the whole display module 120. A side surface of the outer cover 110 may be fixed by the outer housing 150.

The display module 120 may be disposed under the outer cover 110. The display module 120 may output a screen. The screen output from the display module 120 may be viewed through the outer cover 110 from an exterior of the electronic device 100. The module sub-member 125 may be disposed under the display module 120.

The module sub-member 125 may include embossed parts or a sponge. The module sub-member 125 may be disposed under an entirety or a portion of a lower portion of the display module 120. According to various embodiments of the disclosure, the module sub-member 125 may be excluded according to a design scheme.

The heat sink 130 may be disposed between the module sub-member 125 and the inner housing 140, or between the display module 120 and the inner housing 140. The heat sink 130 may include, for example, the first bonding layer 131, the board part 133, an insulating bonding layer 132b, and the insulating layer 134. According to various embodiments of the disclosure, the heat sink 130 may further include the second bonding layer 135 that is disposed under the insulating layer 134. The board part 133 and the insulating bonding layer 132b may be disposed on the insulating layer 134 side-by-side. The board part 133 and the insulating bonding layer 132b may be formed to have the same or similar thicknesses. The first bonding layer 131 and the insulating bonding layer 132b may be formed of the same or similar materials. According to various embodiments of the disclosure, the first bonding layer 131 may be formed of a flexible adhesive material, and the insulating bonding layer 132b may be formed of a hard adhesive material. The board part 133 and the insulating bonding layer 132b may be spaced apart from each other with respect to the gap 139.

The inner housing 140 may be disposed under the heat sink 130. The printed circuit board 145 may be disposed under the inner housing 140. A boss hole may be formed at the boss 160 that is formed in the inner housing 140, and a screw 155 may be inserted into the boss hole. The inner housing 140, the printed circuit board 145, and the outer housing 150 may be coupled to each other by the screw 155. The insulating bonding layer 132b and the insulating layer 134 of the heat sink 130 may be disposed on the screw 155 to prevent an electrical contact with the display module 120. The insulating bonding layer 132b may be disposed on the inner housing 140.

The outer housing 150 may include a bottom on which elements may be arranged such as: the inner housing 140, the heat sink 130, the display module 120, the outer cover 110, and the like, and the outer housing 150 can include sidewalls that surround side surfaces of the elements. The outer housing 150 may be coupled by the screw 155 with the inner housing 140.

Figure 6:
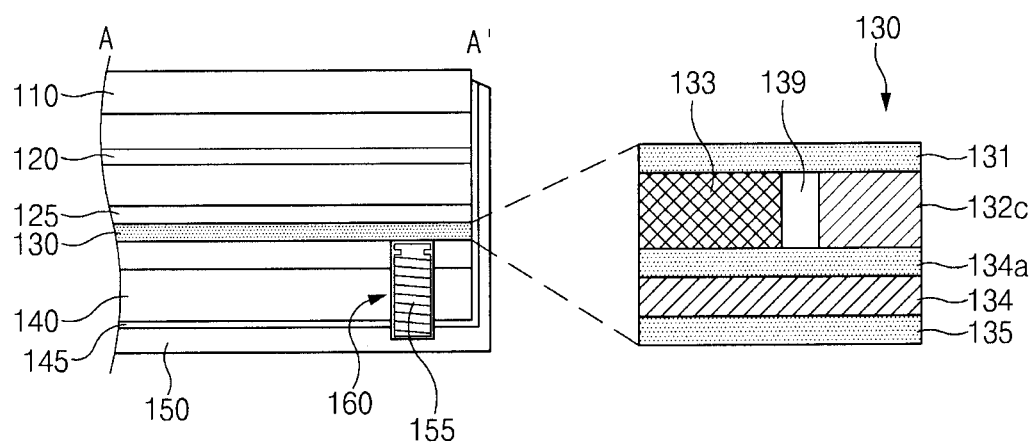
FIG. 6 is a view illustrating another example of a portion of a section of the electronic device according to an embodiment of the disclosure.

FIG. 6 is a view illustrating another example of a portion of a section of the electronic device according to an embodiment.

Referring now to FIG. 6, the electronic device 100 may include the outer cover 110, the display module 120, the heat sink 130, the inner housing 140, and the outer housing 150. In the electronic device 100, the heat sink 130 may be disposed between the display module 120 and the inner housing 140, and an insulating layer may be formed on a surface of the inner housing 140 facing the heat sink 130. According to this structure, the display module 120 and the inner housing 140 are electrically insulated from each other to prevent a shock hazard and possible damage to the battery or the electronic device itself. As compared to the electronic device 100 of FIG. 5, the electronic device 100 of FIG. 6 may include the same or similar configurations except for the heat sink 130.

The heat sink 130 may include the first bonding layer 131, an insulating support layer 132c, the board part 133, an additional bonding layer 134a, and the insulating layer 134. According to various embodiments, the heat sink 130 may further include the second bonding layer 135. According to various embodiments, the insulating support layer 132c may be replaced with the insulating bonding layer 132b disposed in parallel with the board part 133 or with the insulating bonding layer 132 having an adhesive property.

The first bonding layer 131 may be disposed to cover the whole board part 133. Furthermore, the first bonding layer 131 may be disposed to cover an upper surface of the insulating support layer 132c. Accordingly, the insulating support layer 132c and the board part 133 may be adhesively fixed under the display module 120 by the first bonding layer 131.

The insulating support layer 132c may be formed to have a thickness that is the same as, or similar to, that of the board part 133. The insulating support layer 132c may have a shape of a film having a specific hardness. The insulating support layer 132c may be spaced apart from the board part 133 with respect to the gap 139.

A thickness of the board part 133 may be the same as, or similar to, that of the insulating support layer 132c. The board part 133 may perform (or act as) a function of dissipating heat of the display module 120. According to various embodiments, the board part 133 may act as a ground of the display module 120.

The additional bonding layer 134a may be disposed under the board part 133 and the insulating support layer 132c. The additional bonding layer 134a on one surface may fix the board part 133 and the insulating support layer 132c and on an opposite surface may be bonded to the insulating layer 134 disposed under the additional bonding layer 134a. The additional bonding layer 134a may have a surface of which a width corresponds to a sum of widths of the board part 133 and the insulating support layer 132c. According to various embodiments of the disclosure, the additional bonding layer 134a may have an area corresponding to a sum of areas of the board part 133, the insulating support layer 132c, and a gap between the board part 133 and the insulating support layer 132c.

The insulating layer 134 may be disposed under the additional bonding layer 134a. A thickness of the insulating layer 134 may be the same as, or similar to, that of the additional bonding layer 134a. The insulating layer 134 may be formed of a material that is the same as or similar to that of the additional bonding layer 134a. According to various embodiments of the disclosure, the insulating support layer 132c and the insulating layer 134 may be formed of different materials. Furthermore, the insulating layer 134 may have a color that is different from that of the insulating support layer 132c for distinction between the insulating layer 134 and the insulating support layer 132c.

The second bonding layer 135 may be disposed under the insulating layer 134 and may fixedly bond the heat sink 130 to the inner housing 140. According to various embodiments, the second bonding layer 135 may be disposed not on the heat sink 130 but on the inner housing 140 and then bonded to the insulating layer 134 during a stacking process.

A boss or a boss area 160 may be formed at one side of the inner housing 140. A screw hole of the printed circuit board 145 may be disposed in the boss area 160. A screw passing through the screw hole may be coupled with a screw connection part provided in the inner housing 140, and thus the inner housing 140 and the outer housing 150 may be coupled with each other. In the electronic device 100, an insulating layer may be provided under the heat sink 130 that bonds the display module 120 to the inner housing 140 and dissipates heat. Accordingly, the electronic device 100 may prevent an electric shock by preventing a bonding layer between the board part 133 and the inner housing 140 from being damaged due to an external impact. In the electronic device 100, a current flow area may be minimized by inserting an insulating layer between the board part 133 and the bonding layer 135 and recessing a periphery of a boss along a circumference of the board part 133. Furthermore, since a double-sided tape is applied to a recessed portion, adhesion may be increased and a step may be compensated for. Accordingly, it may be possible to prevent a plurality of internal hardware from being deformed or inclined. This structure results in the increased reliability with respect to an impact.

According to various embodiments of the disclosure, an electronic device may include a display module that outputs a screen by using supplied power, an inner housing disposed under the display module, a heat sink disposed between the display module and the inner housing, a surface of the heat sink facing the inner housing being insulated, and an outer housing disposed under the inner housing.

According to various embodiments of the disclosure, at least a portion of the inner housing and at least a portion of the outer housing may be formed of a metallic material.

According to various embodiments of the disclosure, the inner housing may include at least one boss area of a metallic material.

According to various embodiments of the disclosure, the electronic device may further include a printed circuit board disposed between the outer housing and the inner housing.

According to various embodiments of the disclosure, the electronic device may further include a connection member (e.g., a screw) passing though the inner housing and the printed circuit board and connected with the outer housing.

According to various embodiments of the disclosure, the heat sink may perform (or act as) at least one of a function of dissipating heat by the display module or a function of grounding the display module.

According to various embodiments of the disclosure, the heat sink may include a board part that performs (or acts as) a heat-dissipation role of the display module, a bonding layer disposed on the board part, and an insulating layer disposed under the board part.

According to various embodiments of the disclosure, the heat sink may further include an insulating support layer disposed in parallel with the board part.

According to various embodiments of the disclosure, a thickness of the insulating support layer may be the same as (or substantially similar to) a thickness of the board part.

According to various embodiments of the disclosure, the heat sink may further include an additional bonding layer disposed between the board part and the insulating layer.

According to various embodiments of the disclosure, in the heat sink, a gap of a size may be disposed between the board part and the insulating support layer.

According to various embodiments of the disclosure, the board part may include at least one of at least one recess recessed to an inside of the board part from an edge of the board part or a through hole provided to pass through front and rear surfaces of the board part at a location of an inside of the board part.

According to various embodiments of the disclosure, the heat sink may further include an insulating support layer disposed in parallel with the board part and disposed to surround the board part (or disposed at a periphery of the board part). The insulating support layer may include at least one protrusion protruding from an area of the recess to the inside of the board part.

Each of the above-mentioned elements of the electronic device according to various embodiments of the present disclosure may be configured with one or more components, and the names of the elements may be changed according to the type of the electronic device. The electronic device according to various embodiments of the present disclosure may include at least one of the above-mentioned elements, and some elements may be omitted or other additional elements may be added. Furthermore, some of the elements of the electronic device according to various embodiments may be combined with each other so as to form one entity, so that the functions of the elements may be performed in the same manner as before the combination. The apparatuses and methods of the disclosure can be implemented in hardware, and in part as firmware or via the execution of software or computer code in conjunction with hardware that is stored on a non-transitory machine readable medium such as a CD ROM, a RAM, a floppy disk, a hard disk, or a magneto-optical disk, or computer code downloaded over a network originally stored on a remote recording medium or a non-transitory machine readable medium and stored on a local non-transitory recording medium for execution by hardware such as by at least one processor, so that the methods described herein are loaded into hardware such as a general purpose computer, or a special processor or in programmable or dedicated hardware, such as an ASIC or FPGA.

As would be understood in the art, the computer, the processor, microprocessor, controller, control unit or the programmable hardware include memory components, e.g., RAM, ROM, Flash, etc., that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein.

In addition, an artisan understands and appreciates that a "processor", "microprocessor" "controller", or "control unit" constitute hardware in the claimed disclosure that contain circuitry, such as integrated circuitry, that is configured for operation. The control unit/controller may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. Under the broadest reasonable interpretation, the appended claims constitute statutory subject matter in compliance with 35 U.S.C. § 101 and none of the elements are software per se.

Nor are the claims directed to Abstract ideas, and constitute statutory subject matter under 35 U.S.C. § 101. The definition of the terms "unit" or "module" as referred to herein are to be understood as constituting hardware circuitry such as a CCD, CMOS, SoC, AISC, FPGA, at least one processor or microprocessor (e.g. a controller or control unit) configured for a certain desired functionality, or a communication module containing hardware such as transmitter, receiver or transceiver, or a non-transitory medium comprising machine executable code that is loaded into and executed by hardware for operation, in accordance with statutory subject matter under 35 U.S.C. § 101 and do not constitute software per se.

The term "module" used herein may represent, for example, a unit including one or more combinations of hardware, software and firmware. The term "module" may be interchangeably used with the terms "unit", "logic", "logical block", "component" and "circuit". The "module" may be a minimum unit of an integrated component or may be a part thereof The "module" may be a minimum unit for performing one or more functions or a part thereof. The "module" may be implemented mechanically or electronically. For example, the "module" may include at least one of an application-specific IC (ASIC) chip, a field-programmable gate array (FPGA), and a programmable-logic device for performing some operations, which are known or will be developed.

According to various embodiments of the present disclosure, various embodiments may provide a function of preventing an electric shock reliably while maintaining a thin thickness of an electronic device.

Furthermore, various embodiments of the disclosure may provide an electric shock prevention function while maintaining strength of the electronic device and impact robustness.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
 a display module;
 an inner housing disposed under the display module;
 a heat sink disposed between the display module and the inner housing, wherein a surface of the heat sink that faces the inner housing is electrically insulated; and
 an outer housing disposed under the inner housing and having a depth sized to receive the display module, heat sink and the inner housing,
 wherein the heat sink comprises:
 a board part that provides a heat-dissipation of the display module;
 a bonding layer disposed on the board part; and
 an insulating support layer disposed in parallel with the board part horizontally and disposed to surround at least portion of the board part, and
 a gap of a predetermined size is disposed between the board part and the insulating support layer,
 wherein the board part comprises at least one recess recessed to an inside of the board part from a side surface of the board part, and
 wherein a shape of the gap corresponds to a shape of the at least one recess.

2. The electronic device of claim 1, wherein at least a portion of the inner housing and at least a portion of the outer housing are formed of a metallic material, and electrically insulated surface of the heat sink is arranged to prevent a shock hazard between the display module and the inner housing.

3. The electronic device of claim 2, wherein the inner housing comprises at least one boss area of the metallic material.

4. The electronic device of claim 1, further comprising:
 a printed circuit board that is disposed between the outer housing and the inner housing.

5. The electronic device of claim 4, further comprising:
 a connection member that extends though the inner housing and the printed circuit board and connects with the outer housing,
 wherein the connection member is coupled between the inner housing and the outer housing.

6. The electronic device of claim 1, wherein the heat sink provides at least one of a function of dissipating heat by the display module or a function of grounding the display module.

7. The electronic device of claim 1, wherein a thickness of the insulating support layer is the same as a thickness of the board part.

8. The electronic device of claim 1, wherein the heat sink further comprises:
 an additional bonding layer disposed between the board part and the insulating layer.

9. The electronic device of claim 1, wherein the board part further comprises a through-hole that extends through front and rear surfaces of the board part inside of the board part.

10. The electronic device of claim 9, wherein the insulating support layer comprises at least one protrusion extending from an area of the recess to the inside of the board part.

11. The electronic device of claim 1, further comprising an insulating bonding layer having an adhesive component.

12. A heat sink for an electronic device comprising:
- a board part having at least a portion being formed of a metallic material to dissipate heat generated by a display module;
- a bonding layer disposed between the display module and the board part; and
- an insulating support layer disposed under the display module and in parallel with the board part horizontally and disposed at an edge of the board part; and
- a gap of a predetermined size to prevent the insulating support layer from overlapping the board part, wherein the board part comprises at least one recess recessed to an inside of the board part from a side surface of the board part, and wherein a shape of the gap corresponds to a shape of the at least one recess.

13. The heat sink of claim 12, wherein a thickness of the insulating support layer is the same as a thickness of the board part.

14. The heat sink of claim 12, further comprising at least one of an additional bonding layer disposed on one side to fix the board part and an insulating layer and on an opposite surface being bonded to the insulating layer.

15. The heat sink of claim 12, wherein the board part further comprises a through-hole provided to pass through front and rear surfaces of the board part at a location of an inside of the board part.

16. The heat sink of claim 12, wherein the insulating support layer comprises at least one protrusion extending from an area of the at least one recess to the inside of the board part.

* * * * *